US011460811B2

(12) United States Patent
Semon et al.

(10) Patent No.: US 11,460,811 B2
(45) Date of Patent: Oct. 4, 2022

(54) MECHANISM FOR A TIMEPIECE AND TIMEPIECE COMPRISING SUCH A MECHANISM

(71) Applicant: LVMH Swiss Manufactures SA, La Chaux-de-Fonds (CH)

(72) Inventors: Guy Semon, Evette-Salbert (FR); Thomas Mercier, La Chaux-De-Fonds (CH); Thuy-Anh N'Guyen, La Chaux-De-Fonds (CH); Maarten Pieter Lustig, EG Delft (NL)

(73) Assignee: LVMH Swiss Manufactures SA, La-Chaux-de-Fonds (CH)

( * ) Notice: Subject to any disclaimer, the term of this patent is extended or adjusted under 35 U.S.C. 154(b) by 575 days.

(21) Appl. No.: 16/084,459

(22) PCT Filed: Mar. 13, 2017

(86) PCT No.: PCT/EP2017/055872
§ 371 (c)(1),
(2) Date: Sep. 12, 2018

(87) PCT Pub. No.: WO2017/157868
PCT Pub. Date: Sep. 21, 2017

(65) Prior Publication Data
US 2019/0079454 A1    Mar. 14, 2019

(30) Foreign Application Priority Data
Mar. 14, 2016 (FR) .................................. 1652136

(51) Int. Cl.
*G04B 17/26* (2006.01)
*G04B 1/22* (2006.01)
(Continued)

(52) U.S. Cl.
CPC ............... *G04B 17/26* (2013.01); *B81B 5/00* (2013.01); *G04B 1/22* (2013.01); *G04B 15/02* (2013.01);
(Continued)

(58) Field of Classification Search
CPC ........ G04B 15/00; G04B 15/02; G04B 15/06; G04B 15/14; G04B 17/04; G04B 17/045; G04B 17/26
See application file for complete search history.

(56) References Cited

U.S. PATENT DOCUMENTS 1,522,099 A    1/1925 Brigden
2,481,213 A    9/1949 Gummersall
(Continued)

FOREIGN PATENT DOCUMENTS

CH    442 153 A    3/1967
EP    1 736 838 A1    12/2006
(Continued)

OTHER PUBLICATIONS

International Search Report related to Application No. PCT/EP2017/055872; dated Jun. 28, 2017.

*Primary Examiner* — Edwin A. Leon
*Assistant Examiner* — Jason M Collins
(74) *Attorney, Agent, or Firm* — von Briesen & Roper, s.c.

(57) ABSTRACT

A timepiece mechanism comprising a regulator, an energy distributing member a pallet fork controlled by the regulator to alternate in locking and releasing the energy distributing member, and a decoupling member elastically connected to the pallet fork and to the regulator. The decoupling member is arranged so as to oscillate between two stop elements.

20 Claims, 13 Drawing Sheets

(51) Int. Cl.
  *G04B 15/06* (2006.01)
  *G04B 15/14* (2006.01)
  *G04B 17/04* (2006.01)
  *G04B 15/02* (2006.01)
  *B81B 5/00* (2006.01)

(52) U.S. Cl.
  CPC ............. *G04B 15/06* (2013.01); *G04B 15/14* (2013.01); *G04B 17/045* (2013.01); *B81B 2201/035* (2013.01); *B81B 2201/037* (2013.01)

(56) References Cited

U.S. PATENT DOCUMENTS

| | | |
|---|---|---|
| 3,440,815 A | 4/1969 | Berney |
| 5,535,178 A | 7/1996 | Hayenga |
| 2012/0063274 A1* | 3/2012 | Uchiyama .............. G04B 15/06 368/127 |

FOREIGN PATENT DOCUMENTS

| | | |
|---|---|---|
| EP | 2 090 941 A1 | 8/2009 |
| EP | 2 706 416 A1 | 3/2014 |
| EP | 2 947 522 A1 | 11/2015 |

* cited by examiner

MECHANISM FOR A TIMEPIECE AND TIMEPIECE COMPRISING SUCH A MECHANISM

CROSS-REFERENCE TO RELATED APPLICATION

This Application is a 35 USC § 371 US National Stage filing of International Application No. PCT/EP2017/055872 filed on March 13, and claims priority under the Paris Convention to French Patent Application No. 16 52136 filed on Mar. 14, 2016.

FIELD OF THE DISCLOSURE

The present invention relates to mechanisms for timepieces and to timepieces comprising such a mechanism.

BACKGROUND OF THE DISCLOSURE

Mechanisms for timepieces are known which comprise:
- a regulator comprising a regulating member adapted to oscillate with a certain nominal amplitude and a certain period of oscillation,
- an energy distributing member provided with teeth and intended to be biased by an energy storage device,
- a pallet fork engaging with the teeth of the energy distributing member, said pallet fork being controlled by the regulator to periodically and alternately lock and release the energy distributing member so that said energy distributing member is biased by the energy storage device to move in incremental steps in a cycle of repetitive motion, said pallet fork being adapted to transfer mechanical energy to the regulator during the cycle of repetitive motion.

The nominal oscillation amplitude of the regulating member is the oscillation amplitude under normal operating conditions, when the energy storage device is normally loaded with energy.

These known mechanisms of this type have the disadvantage that, when the energy storage device no longer has sufficient energy, the oscillation amplitude of the regulator decreases, which changes its frequency and disrupts the temporal precision of the mechanism.

SUMMARY OF THE DISCLOSURE

The present invention is intended to overcome this disadvantage.

To this end, according to the invention, a mechanism of the kind in question is characterized in that it comprises:
- a decoupling member elastically connected to the pallet fork by first elastic linking means and to the regulating member by second elastic linking means, said decoupling member being arranged to oscillate with a certain amplitude between first and second extreme positions and with the same period of oscillation as the regulating member,
- motion limiting means for imposing said extreme positions (these extreme Positions are advantageously fixed relative to the frame or structure on which the regulating member is mounted and oscillating).

In other words, the oscillation amplitude of the decoupling member imposed by the limiting means is lower than the oscillation amplitude this same decoupling member would have in the absence of the limiting means. The two extreme positions of the decoupling member are geometrically constrained by these limiting means.

With these arrangements, the oscillation amplitude of the decoupling member remains constant, even if the energy stored in the energy storage device decreases substantially, so that the oscillator continues to operate normally; under these conditions, the temporal precision of the mechanism is thus preserved.

In various embodiments of the mechanism according to the invention, one or more of the following arrangements may possibly be used:
- the motion limiting means comprise two stop elements between which the decoupling member oscillates;
- the pallet fork and the energy distributing member are shaped so that, whenever the energy distributing member moves, said energy distributing member supplies an impulse to the pallet fork in order to transfer mechanical energy to the first elastic linking means just before being relocked by the pallet fork: this locking at the end of the impulse implies that the position of the pallet, fork is fixed at the end of an impulse, which helps in accurately and consistently determining the amount of energy transmitted to the first elastic means (this amount of energy is determined by the deformation of the first elastic means);
- the pallet fork is mounted on an elastic suspension;
- the pallet fork and the first elastic linking means are designed so that the pallet fork only releases the energy distributing member when the decoupling member is in the immediate vicinity of one of the first and second extreme positions (including the case where the decoupling member is in one of the first and second extreme positions): this prevents the disengagement of the pallet fork from disrupting the regulator;
- the energy distributing member is an escape wheel and the pallet fork comprises first and second stop members arranged one on each side of the escape wheel along an escape direction, the first and second stop members being adapted to alternate in locking the teeth of the escape wheel, the pallet fork being mounted and shaped so as to occupy first and second rest positions respectively when the first and second stop members lock the teeth of the escape wheel, and to oscillate between two extreme oscillation positions located one on each side of the two rest positions along the escape direction;
- the decoupling member is movable along the escape direction between said first and second extreme positions, the first elastic linking means being designed to move the pallet fork in a first direction along the escape direction by distancing the first stop member from the escape wheel when the decoupling member is in the immediate vicinity of the first extreme position, the first elastic linking means being designed to move the pallet fork in a second direction opposite to the first direction along the escape direction by distancing the second stop member from the escape wheel when the decoupling member is in the immediate vicinity of the second extreme position, the first extreme position being offset along the first direction relative to the second extreme position;
- the pallet fork and the escape wheel are shaped such that, whenever the escape wheel moves, said escape wheel supplies an impulse to the pallet fork in order to transfer mechanical energy to the first elastic linking means just before being relocked by the pallet fork;
- the escape wheel is designed to rotate in a single direction of rotation and each tooth of the escape wheel has a convex front edge, oriented in the direction of rotation, which is adapted to act as a cam on either the first stop member or the second stop member in order to supply said impulse to the pallet fork, said convex front edge extending in an angular direction that is opposite to the direction of rotation, to a stop edge adapted to abut against either the first stop member or the second stop member in order to lock the escape wheel;

the escape wheel and the pallet fork are designed so that at the end of each impulse, the first elastic linking means are in a state of elastic deformation dictated geometrically either by the first rest position of the pallet fork and the second extreme position of the decoupling member or by the second rest position of the pallet fork and the first extreme position of the decoupling member; this guarantees that constant mechanical energy is transferred to the regulator in each cycle;

the amplitude of the decoupling member is less than 25% of the nominal oscillation amplitude of the regulating member, more particularly less than 20% of the nominal oscillation amplitude of the regulating member;

the amplitude of the decoupling member is greater than 5% of the nominal oscillation amplitude of the regulating member, in particular greater than 10% of the nominal oscillation amplitude of the regulating member;

the motion limiting means are adapted to keep the decoupling member motionless for a certain stop at each of the extreme positions, the decoupling member being immobilized during each period of oscillation for a total stop time which is greater than 75% of the period of oscillation, in particular greater than 80% of the period of oscillation;

the total stop time is less than 95% of the period of oscillation, in particular less than 90% of the period of oscillation;

the decoupling member is rigid;

the regulator, the pallet fork, and the decoupling member constitute an integral one-piece system formed in a same plate and are de signed to move substantially within a central plane of said plate;

the decoupling member is guided by an elastic suspension connecting said decoupling member to a fixed support.

The invention also relate; to a timepiece comprising a mechanism as defined above.

BRIEF DESCRIPTION OF DRAWINGS

Other features and advantages of the invention will be apparent from the following description of one of its embodiments, given as a non-limiting example, which reference to the accompanying drawings.

In the drawings.

DETAILED DESCRIPTION

In the various figures, the same references denote identical or similar elements.

Figure 1:
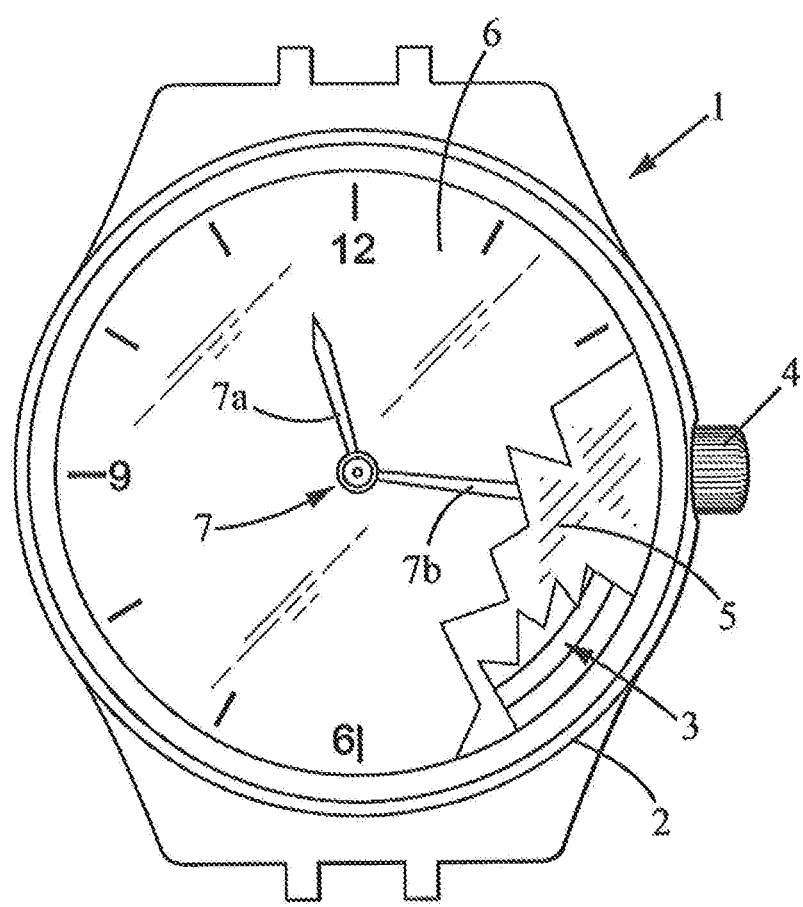
FIG. 1 is a schematic view of a timepiece which can comprise a mechanism according to an exemplary embodiment of the invention.

FIG. 1 shows a timepiece such as a watch, comprising:
a case 2,
a timepiece movement 3 contained in the case 2,
generally a crown 4,
a dial 5,
a crystal 6 covering the dial 5,
a time indicator 7, for example comprising two hands 7a, 7b respectively for the hours and minutes, arranged between the crystal 6 and the dial 5 and actuated by the timepiece movement 3.

Figure 2:
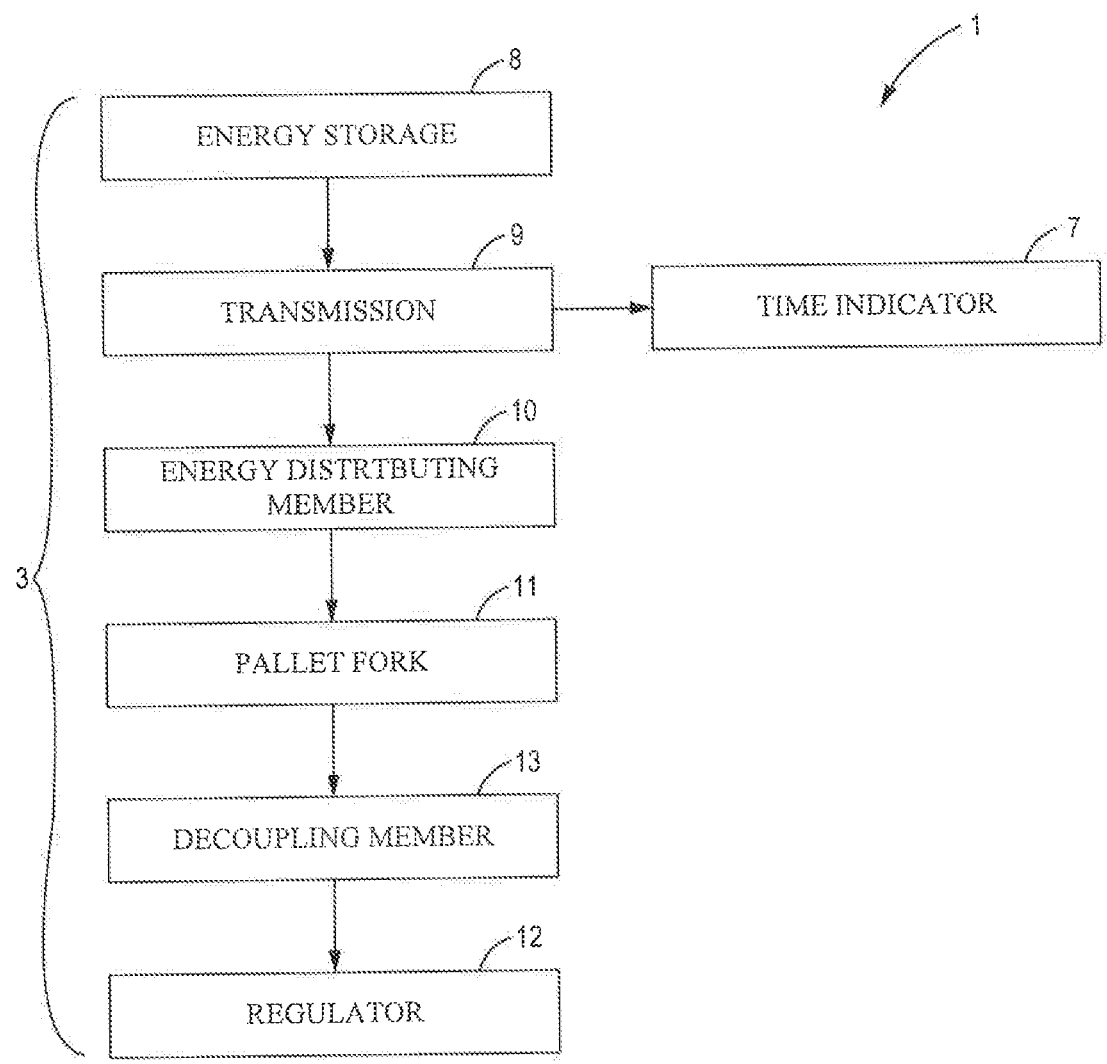
FIG. 2 is a block diagram of the movement of the timepiece of FIG. 1.

As schematically shown in FIG. 2, the watch movement 3 may for example comprise:
a mechanical energy storage device 8, typically a mainspring,
a mechanical transmission 9 driven, by the mechanical energy storage device 8,
said time indicator 7,
an energy distributing member 10 (for example an escape wheel),
a pallet fork 11 adapted to sequentially retain and release the energy distributing member 10,
a regulator 12, which is a mechanism comprising an oscillating regulating member controlling the pallet fork 11 to move it periodically so that the energy distributing member is moved in incremental steps at constant time intervals,
and a decoupling member 13 which is interposed between the regulator 12 and the pallet fork 11.

The decoupling member 13 is connected elastically to the pallet fork 11 by first elastic linking means R1 (first spring—not shown in FIGS. 1 and 2), and to the regulating member by second elastic linking means R2 (second spring—not shown in FIGS. 1 and 2). This decoupling member 13 is arranged to oscillate between two extreme positions with the same period of oscillation as the regulating member but with a lower amplitude, which is imposed by motion limiting means (advantageously, two stops between which the decoupling member oscillates and which limit the travel of the decoupling member so as to cause it to remain motionless for a portion of the period of oscillation).

The timepiece movement 3 will now be explained in more detail with reference to FIGS. 3 and 3A, which represent a first embodiment where the regulator 12, the pallet fork 11, and the decoupling member 13 constitute an integral one-piece system formed in the same plate 14 (usually flat) and are designed to move substantially within a central plane of Said plate 14. However, the invention is not limited to such an integral system, as the abovementioned decoupling member 13 may be provided in any timepiece movement.

Figure 3:
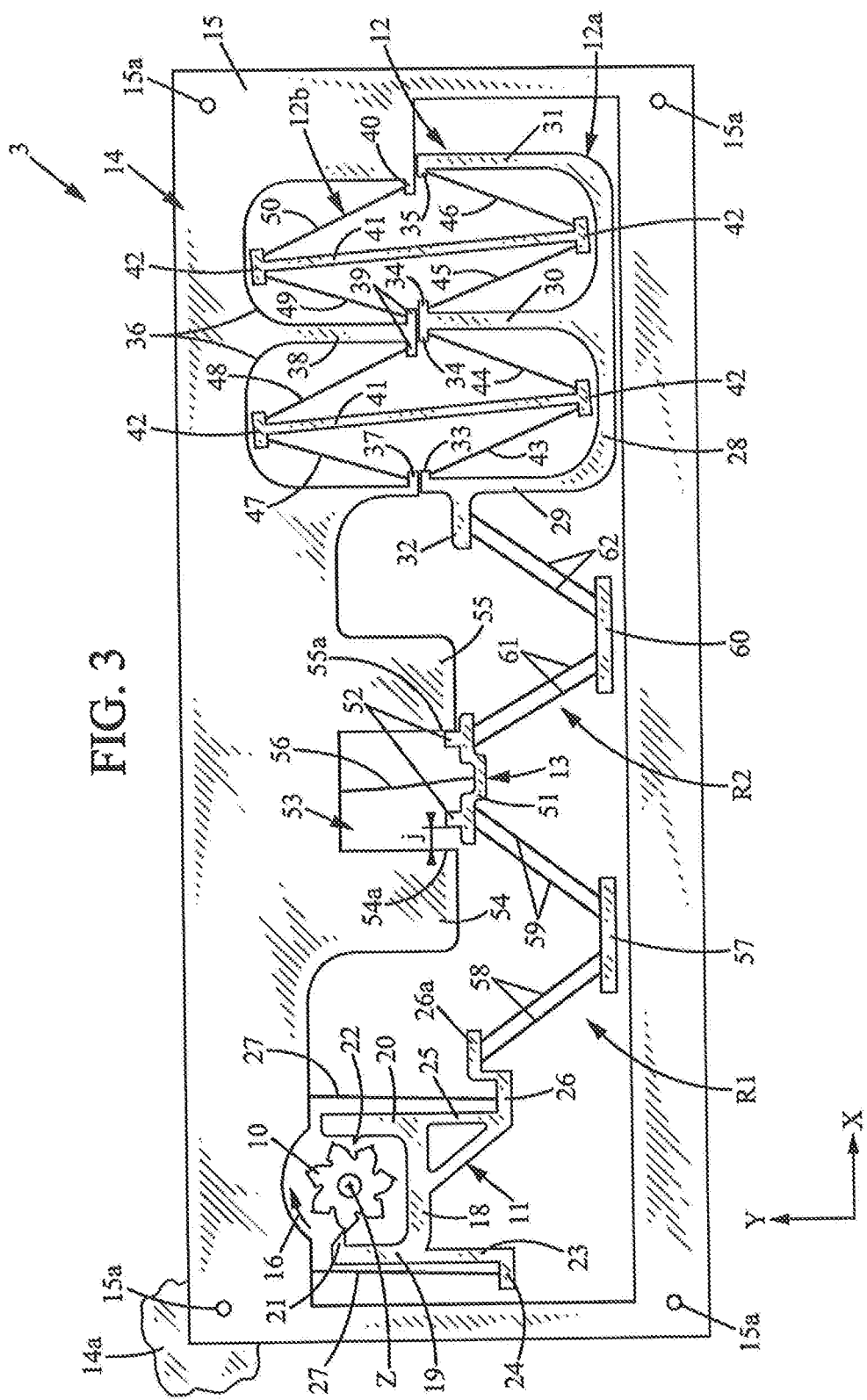
FIG. 3 is a plan view of part of the movement of FIG. 2 comprising the regulator, the decoupling member, the pallet fork, and the energy distributing member, according to a first embodiment of the invention.
Figure 3A:
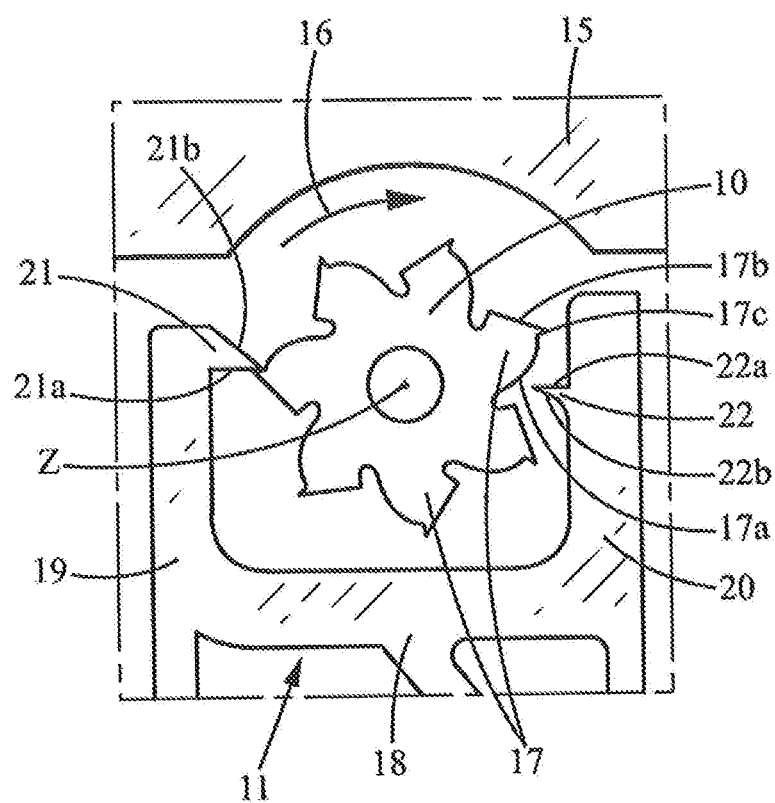
FIG. 3A is an enlarged detail view showing the energy distributing member and a portion of the pallet fork.

In the example of FIGS. 3 and 3A, the plate 14 may be thin, for example about 0.1 to about 0.6 mm depending on the nature of the material of the plate 14.

The plate 14 may have transverse dimensions, in the plane XY of the plate (width and length, or diameter), of between about 15 mm and 40 mm. X and Y are two perpendicular axes defining the plane of the plate 14.

The plate 14 may be produced using any suitable rigid material, preferably having a low Young's modulus in order to exhibit good elastic properties and a low oscillation frequency. Examples of suitable materials for creating the plate 14 include silicon, nickel, iron/nickel alloy, steel, and titanium. In the case of silicon, the thickness of the plate 14 may for example be between 0.2 and 0.6 mm.

The various members formed in the plate 14 are obtained by creating openings in the plate 14, obtained by any fabrication process used in micromechanics, particularly the processes used for the fabrication of MEMS.

In the case of a silicon plate 14, the plate may be locally hollowed out for example by deep reactive ion etching (DRIE), or possibly by laser cutting for small series.

In the case of a plate 14 of iron/nickel, the plate may in particular be created by a LIGA process, or by laser gutting.

In the case of a plate 14 of steel or titanium, the plate 14 may be hollowed out for example by wire electrical discharge machining (WEDM).

The constituent parts of the mechanism will now be described in more detail. Some of these parts are rigid and others are elastically deformable, essentially bendable. The difference between the rigid parts and the elastic parts is their stiffness in the XY plane of the plate 14, which is due to their shape and in particular their slenderness. The slenderness can be measured in particular by the slenderness ratio (length/width ratio of the portion concerned). For example, the rigid portions have a stiffness that is at least approximately 1000 times higher in the plane than the elastic portions. Typical dimensions for the elastic connections, for example the elastic arms 27, 43-50, 56, 58, 59, 61, 62 which will be described below, include lengths ranging for example between 5 and 13 mm and widths ranging for example between 0:01 mm (10 μm) and 0.04 mm (40 μm), in particular about 0.025 mm (25 μm).

The plate 14 forms a fixed outer frame 15 which is fixed to a support plate 14a, for example by screws or the like (not show) traversing holes 15a in the frame 15. The support plate 14a is integral to the case 2 of the timepiece 1. The frame 15 may at least partially surround the energy distributing member 10, the pallet fork 11, the regulator 12, and the decoupling member 13.

The energy distributing member 10 may be a rotatably mounted escape wheel, mounted for example on the support plate 14a so as to be rotatable about an axis of rotation Z perpendicular to the XY plane of the plate 14. The energy distributing member 10 is biased by the energy storage 8 in a single direction of rotation 16.

The energy distributing member 10 has external teeth 17 which, in the example shown, have a front edge 17a (in the direction of rotation 16) which may be convex for example, a rear edge 17b (opposite to the direction of rotation 16) which may be relatively straight, and a tip 17c protruding at the end of the tooth 17 and forming a stop edge. The tip 17e may form a substantially radial edge relative to the axis of rotation Z, oriented in the direction of rotation 16.

The pallet fork 11 is a rigid part which may comprise a rigid body 18 extending for example parallel to the X axis and two parallel rigid side arms 19, 20 extending for example parallel to the Y axis, one on each side of the energy distributing member 10. The arms 19, 20 respectively comprise two stop members 21, 22 in the form of fingers projecting towards one another along the direction of the X axis, from the arms 19, 20. Advantageously, each stop member is wedge-shaped and comprises a stop face 21a, 22a arranged substantially radially relative to the axis of rotation Z and oriented in the direction opposite the direction of rotation 16, and an opposite face 21b, 22b.

Figure 9:
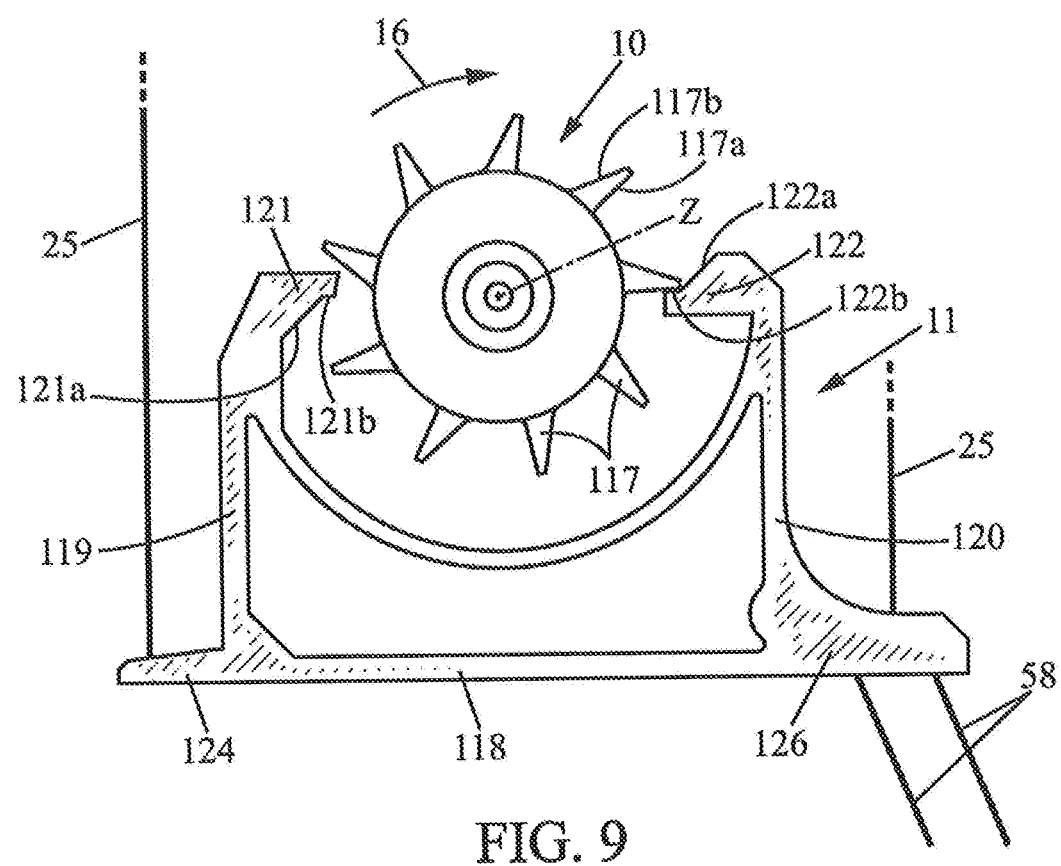
FIG. 9 is a detail view similar to FIG. 3A, in a variant of the first embodiment of the invention.

Alternatively, as shown in FIG. 9, the profiles of the teeth 117 of the escape wheel 10 and the stop members 121, 122 of the pallet fork 11 may be implemented in reverse. In this case, the teeth 117 of the wheel may have a simple profile without a protruding tip, with a front edge 117a (in the direction of rotation 16) which may be for example straight and radial to the axis of rotation Z0, and a rear edge 117b (opposite to the direction of rotation 16) which may be relatively straight and oblique relative to the radial direction. The pallet fork 11 may be movably mounted for example in the same manner as in FIG. 3. The pallet fork 11 is a rigid piece which may have a rigid body 118 which extends for example parallel to the X axis and two parallel rigid lateral arms 119, 120 extending for example parallel to the Y axis, one on each side of the energy distributing member 10. The arms 119, 120 respectively comprise the two finger-shaped stop members 121, 122 projecting towards one another along the direction of the X axis, from the arms 119, 120. In the variant of FIG. 9, each stop member 121, 122 may comprise an impulse ramp 121a, 122a which the ends of the teeth 117 slide against in the direction of the arrow 16, each impulse ramp 121a, 122a terminating, in the direction of rotation 16 of the wheel 10, in a stop lip 121b, 122b which is substantially radial to the axis of rotation Z.

The pallet fork 11 is elastically connected to the frame 15 so as to be movable in parallel to the X axis, thereby forming the escape direction. Advantageously, the pallet fork 11 can be connected to the frame 15 by an elastic suspension, for example comprising two elastic arms 27 substantially parallel to the Y axis. It is possible for the elastic arms 27 to be arranged one on each side of the lateral arms 19, 20, and the pallet fork 11 may have two legs 23, 25 which extend along the Y axis opposite to the lateral arms 19, 20, these legs being terminated by lugs 24, 26 extending along the X axis. The elastic arms 27 may possibly be connected to these lugs 24, 26. Lug 26 which is located nearer the regulator 12 may possibly be extended towards said regulator by means of an extension 26a whose usefulness will be seen further below.

The regulator 12 is a mechanical oscillator comprising a rigid regulating member 12a, forming an inert mass, and an elastic suspension 12b that connects the regulating member 12a to the frame 15. This elastic suspension allows the regulating member to oscillate with a given period of oscillation and a given nominal amplitude A0 (not shown). In the example shown, the elastic suspension 12b is adapted so that the regulating member 12a oscillates substantially in rectilinear translation, parallel to the X axis, but the regulator 12 could be of any other type, in particular rotatable.

In the example considered, the regulating member 12a may comprise a rigid body 28 extending substantially along the x axis, and three parallel rigid arms 29-31 extending along the Y axis from the body 28, for example in the same direction as said lateral arms 19, 20. The arm 29 closest to the pallet fork 11 may comprise an outer lug 32 extending along the X axis. Arms 29, 30 may comprise internal lugs, respectively 33, 34, extending towards one another along the X axis. Arms 30, 31 may also comprise internal lugs, respectively 34, 35, extending towards one another along the X axis.

The frame 15 may possibly comprise two recesses 36 respectively opening into the spaces left free between the arms 29, 30, 31 of the regulating member 12a. These recesses 36 are separated by a rigid arm 38 extending along the Y axis. The recess 36 closest to the pallet fork 11 may comprise, at its opening towards the regulating member 12a, lugs 37, 39 extending towards one another along the X axis. The recess 36 furthest from the pallet fork 11 may comprise, at its opening towards the regulating member 12a, lugs 39, 40 extending towards one another along the X axis.

The elastic suspension 22b may comprise two rigid rods 41, extending substantially along the Y axis, respectively in the recesses 36 and in the spaces left free between the arms 29, 30, 31 of the regulating member 12a. Each of these rods 41 may comprise, at each of its longitudinal ends, an enlarged head 42 extending substantially along the X axis. The heads 42 of the rods 41 may be respectively connected by elastic arms 43-50 to said lugs 33-35 of the regulating member 12a and to the lugs 37, 39, 40 of the frame 15. Other types of elastic suspension 12b are of course possible.

The decoupling member 13 may be a rigid part, comprising for example a rigid body 51 which extends substantially along the X axis and two rigid arresters 52 protruding in the direction of the Y axis into a recess 53, formed in the frame 15 on the same side as the abovementioned recesses 36, between two rigid stop elements 54, 55.

The decoupling member 13 is mounted in suspension in the frame 15 by the elastic linking means R1, R2 in order to allow oscillating substantially in translation along the X axis, such that the arresters 52 abut in turn against the facing stop faces 54a, 55a of the stop elements 54, 55, with a total travel distance j, but the movement of the decoupling member 13 may be of another type, in particular rotatable. The oscillation amplitude j/2 of the decoupling member is less than the nominal amplitude A0 of the regulating member 12a.

This movement may possibly be further guided by at least one elastic arm 56 extending into the recess 53 substantially along the axis and connecting the decoupling member 13 to the frame 15.

Advantageously, A0 and j are such that the amplitude j/2 is less than 25% of A0, in particular less than 20% of A0. The amplitude of j/2 may be greater than 5% of A0, in particular greater than 10% of A0.

Thus, the decoupling member 13 remains stationary against the stop elements 54, 55 for a total stop time which is greater than 75% of the period of oscillation T, in particular greater than 80% of T. The total stop time may be less than 95% of the period of oscillation T, in particular less than 90% of T.

The elastic linking Means R1, R2 may be of any known type. In the example considered, the elastic linking means R1 may comprise elastic arms 58, 59 interconnected by a rigid intermediate member 57 extending for example along the X axis. The elastic arms 58, 59 extend in a V which is open towards the side of the frame 15 having the recess 53, respectively to the extension 26a of the pallet fork 11 and to the body 51 of the decoupling member 13. The elastic linking means R1 comprise two parallel elastic arms 58 and two parallel elastic arms 59 in the example shown, but could optionally comprise one elastic arm 58 and/or one elastic arm 59, or different numbers of elastic arms, depending on the elastic stiffness desired.

Similarly, the elastic linking means R2 may comprise elastic arms 61, 62 interconnected by a rigid intermediate member 60 extending for example along the X axis. The elastic arms 61, 62 extend in a V which is open towards the side of the frame 15 having the recess 53, respectively to the body 51 of the decoupling member 13 and to the outer lug 32 of the regulating member 12a. The elastic linking means R2 comprise two parallel elastic arms 61 and two parallel elastic arms 62 in the example shown, but could optionally comprise one elastic arm 61 and/or one elastic arm 62, or different numbers of elastic arms, depending on the elastic stiffness desired.

The mechanism described above functions as follows. In the following, the concepts of up/down, right/left may be used to clarify the description with respect to the orientation of the drawings of FIGS. 3 to 8, but these indications are non-limiting.

In the situation in FIG. 3, the pallet fork 11 is in a first rest position and the energy distributing member 10 is stopped, the tip 17c of the tooth 17 located to the left being in contact with the stop face 21a of the stop member 21 located on the left of the pallet fork 11.

The decoupling member 13 is in its extreme right position (in abutment against the right stop element 55) or close to this position, and the regulating member 12a is close to its extreme right position.

The first elastic means R1 have a maximum elongation geometrically dictated by the left position of the pallet fork 11 (first rest position) and the right position of the decoupling member 13 (second extreme position). The mechanical energy then stored in, the first elastic means R1 is therefore predetermined, constant in each cycle.

Figure 4:
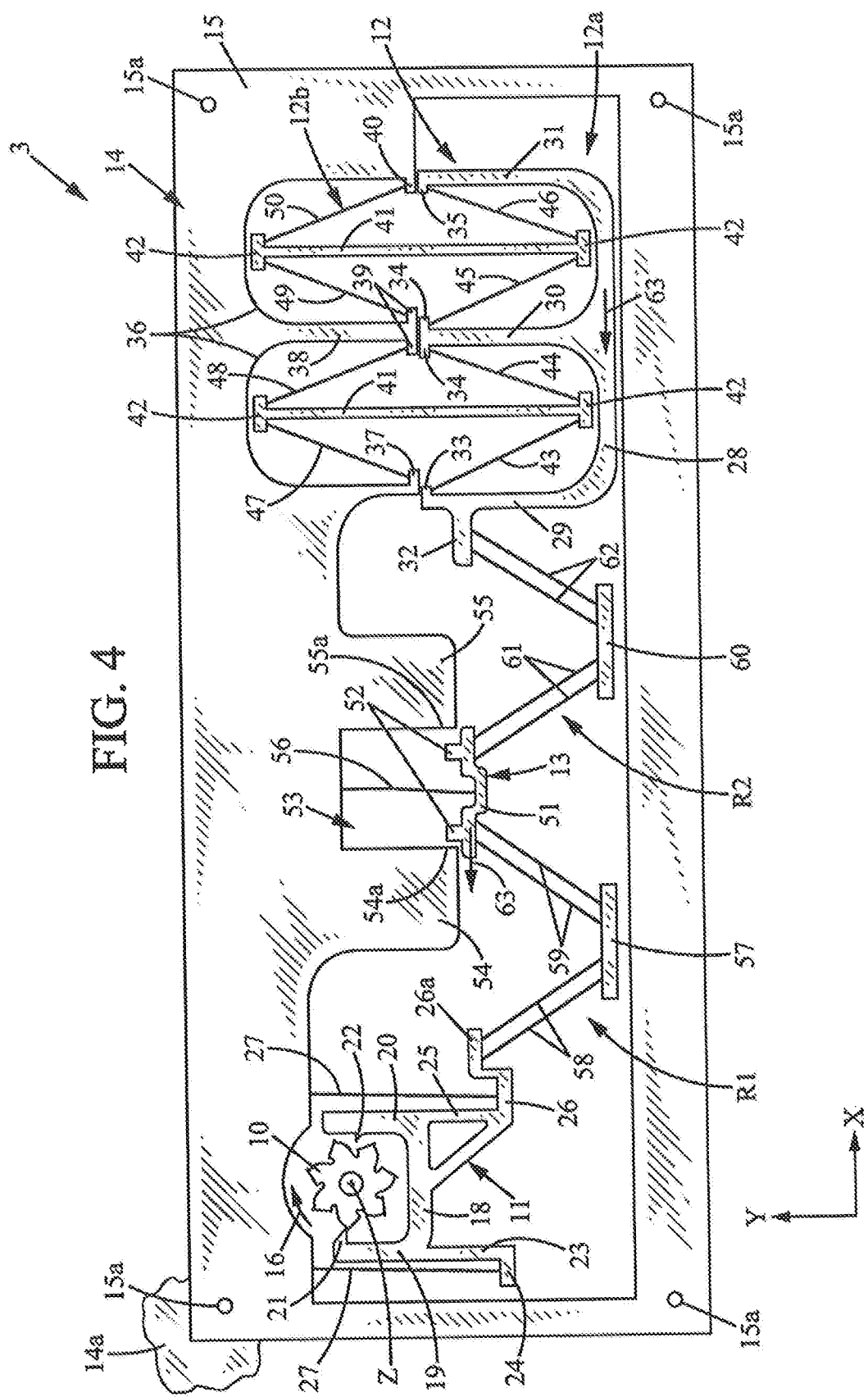
FIGS. 4 to 8 are views similar to FIG. 3, showing different successive positions of the mechanism.

Starting from the position of FIG. 3, as shown in FIG. 4, the regulating member 12a moves to the left in the direction of the arrow 63, and the decoupling member 13 also moves to the left in the direction of the arrow 63.

The energy previously accumulated in the first elastic means R1 is then transmitted to the regulator 12 to maintain its oscillation, by pulling the regulating member 12a to the left.

As long as the first elastic means R1 are elongated, they pull the pallet fork 11 to the right and thus hold it in its first position, locking the energy distributing member 10 as explained above.

Figure 5:
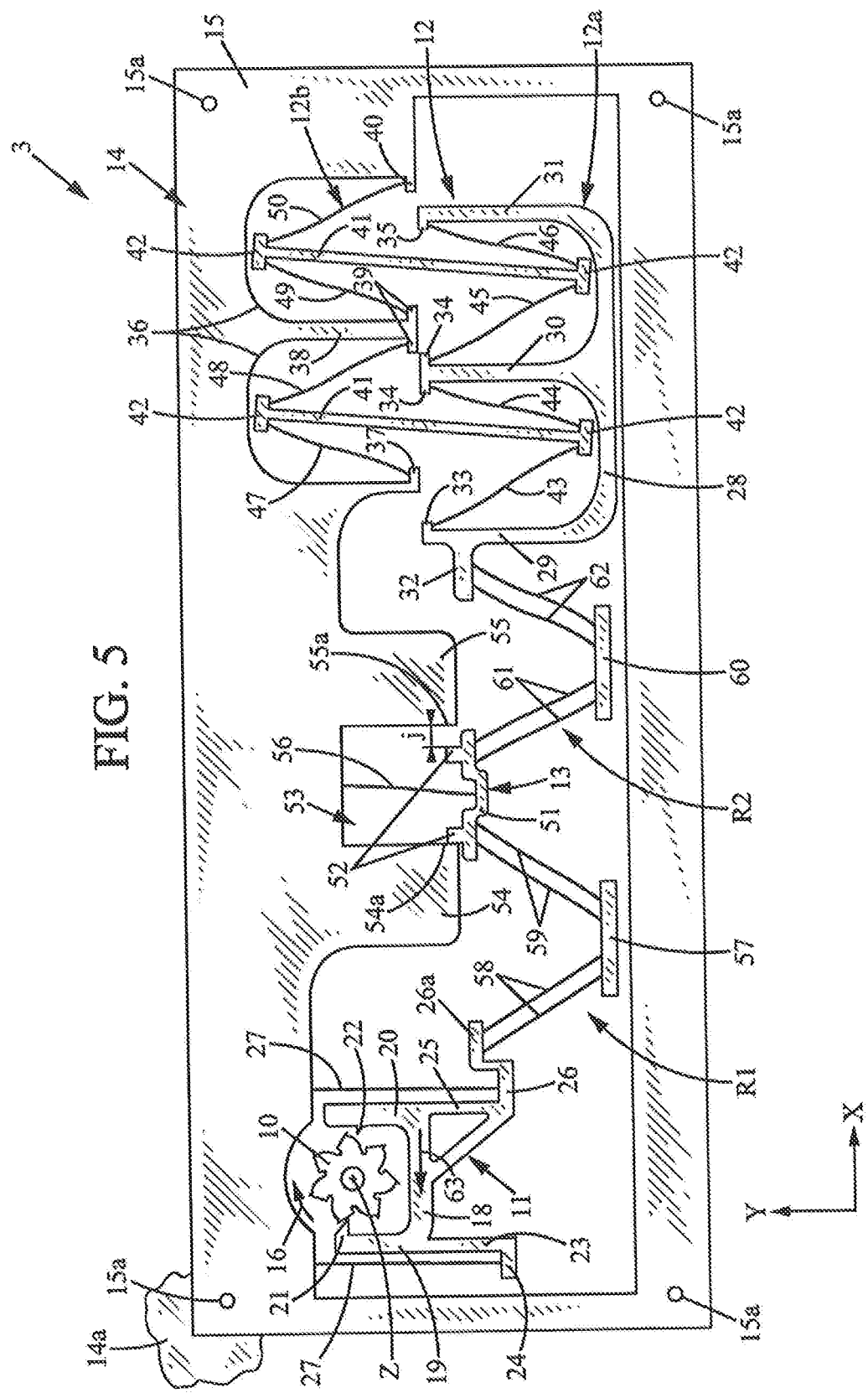

When the decoupling member 13 is close to reaching its extreme left position or second extreme position (in abutment against the left stop element 54), as shown in FIG. 5, the first elastic means R1 are near their resting length and drive the pallet fork 11 to the left, which causes it to leave its first position, thereby allowing the escape of the energy distributing member 10, which can then rotate in the direction of rotation 16.

Figure 6:
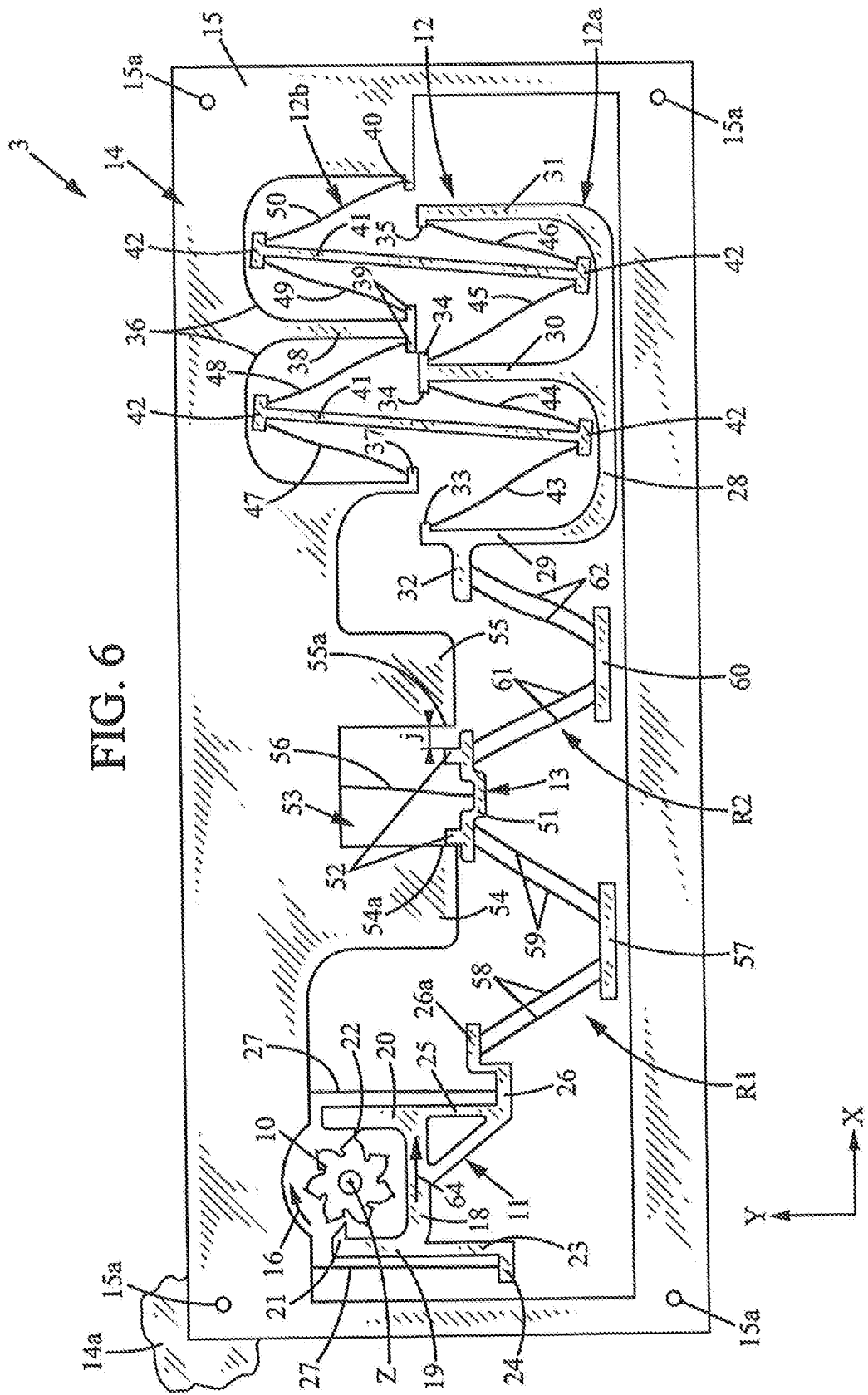

Due to the escape of the energy distributing member 10, the convex front edge 17a of the tooth 17 located to the right comes into contact with the stop member 22 located on the right of the pallet fork 11 which, by caroming action, causes the pallet fork 11 to move to the right in the direction of arrow 64 to a second rest position where the tip 17c of the tooth 17 located to the right bears against the stop face 22a of the stop member 22 (FIG. 6). This impulse supplied by the energy distributing member 10 transfers energy to the first elastic means R1, compressing them. During this movement, the decoupling member 13 remains in its extreme left position (first extreme position) against stop element 54, and the regulating member 12a is then in its extreme left position or near this position.

The first elastic means R1 then exhibit minimal elongation, determined geometrically by the right position of the pallet fork 11 and by the left position of the decoupling member 13. The first elastic means R1 then have a predetermined accumulated mechanical energy which is constant in each cycle.

In addition, the escape and the supplying of energy in the first elastic means R1 occurs when the decoupling member 13 is in abutment, meaning that the regulating member 12a oscillates more or less freely. The oscillation of the regulating member 12a is therefore not disturbed by the escape of the energy distributing member 10 and the impulse that it provides to the pallet fork 11.

Figure 7:
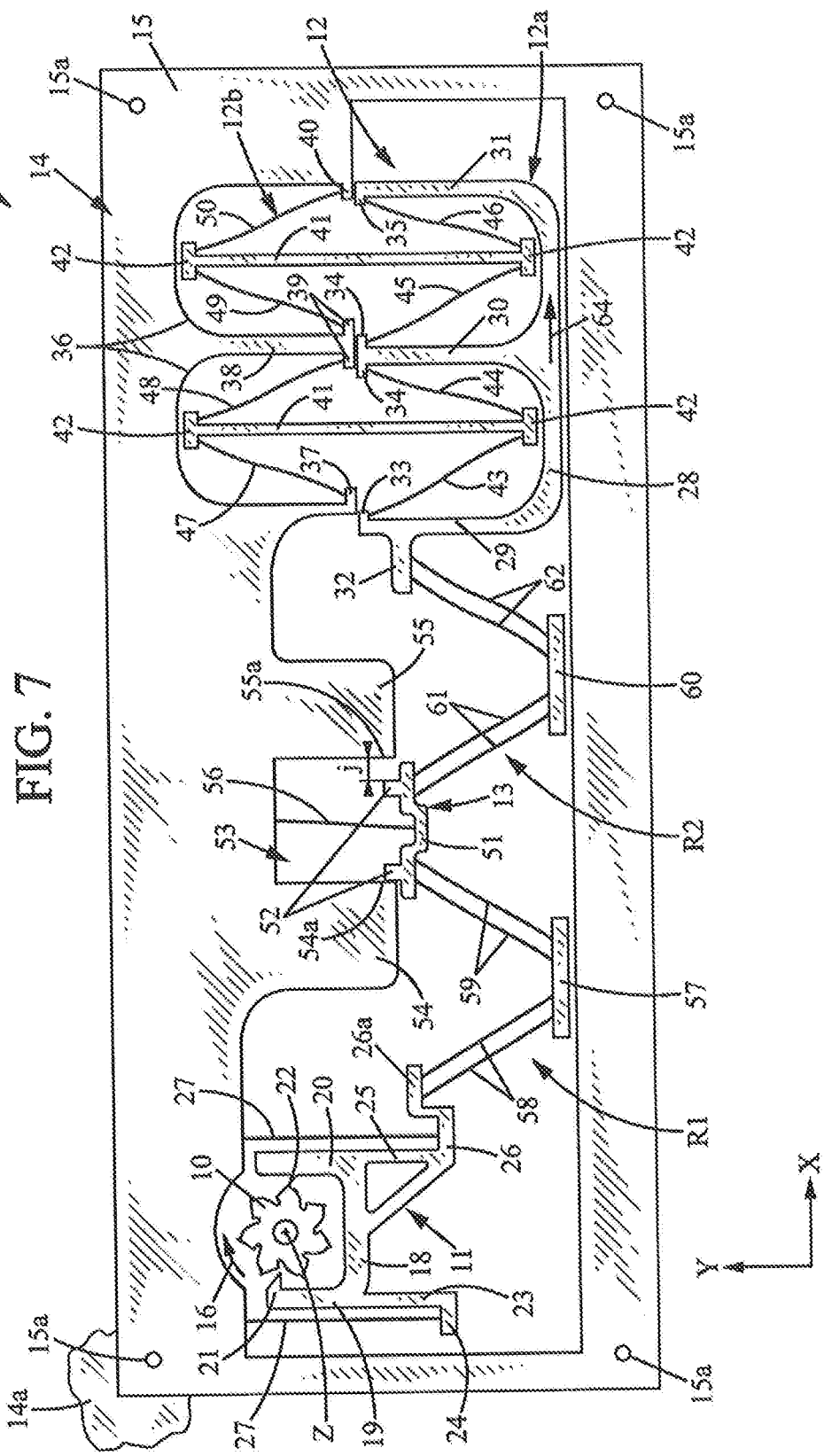
Figure 8:
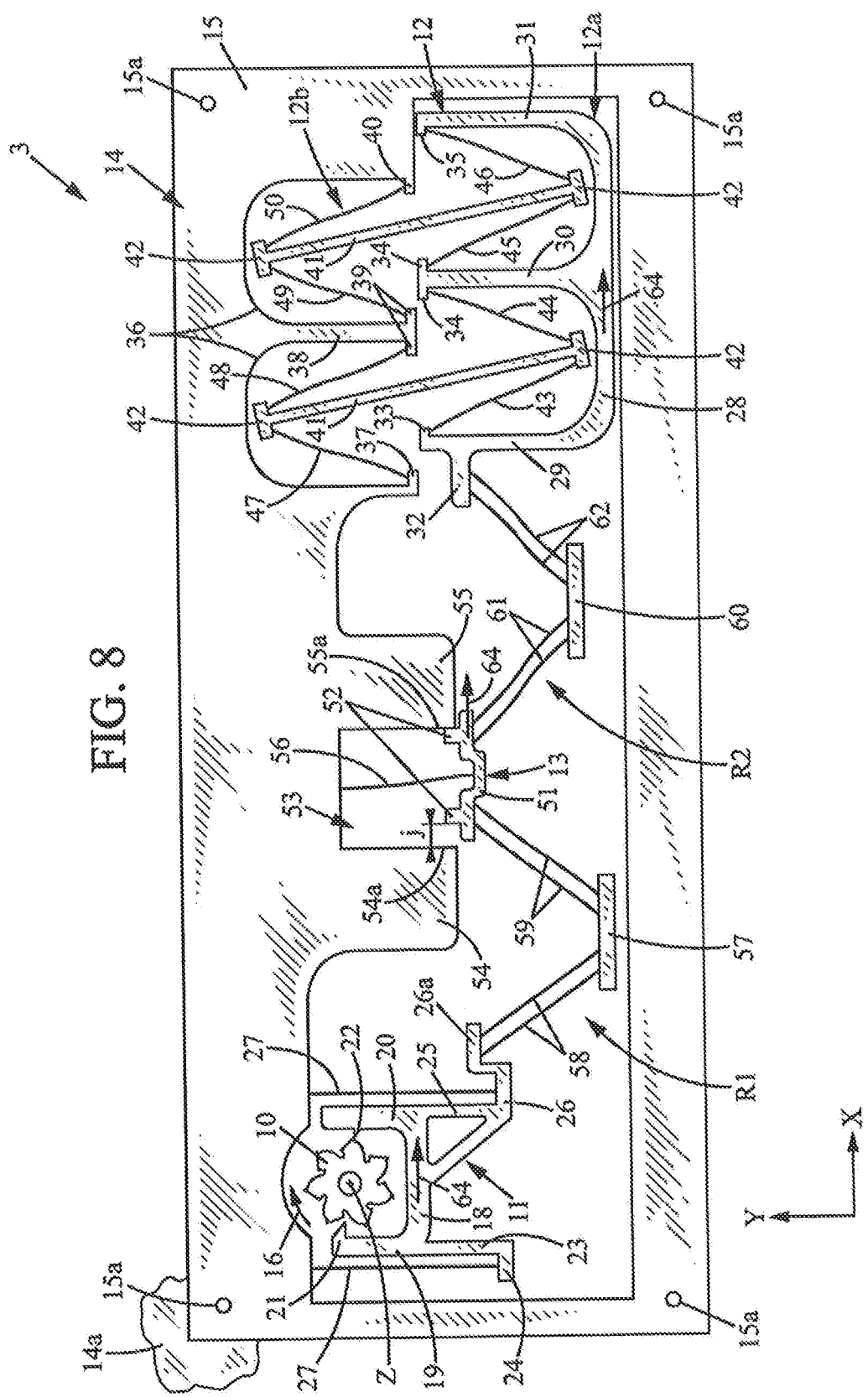

As shown in FIG. 7, the regulating member 12a then resumes its motion by moving to the right in the direction of arrow 64 and its oscillation is maintained by the energy accumulated in the first elastic means R1, which is distributed into the system.

At, the end of this motion, the pallet fork 11 is pulled to the right in the direction of arrow 64 (FIG. 8), so that the energy distributing member 10 escapes and rotates in the direction of rotation 16. Then, the convex front edge 17a of the tooth 17 located to the left engages with stop member 21 of the pallet fork by caroming action, moving the pallet fork 11 to the left so as to return to the situation in FIG. 3.

These steps are then repeated indefinitely.

The device just described has the following advantages:
the decoupling member 13 and the springs R1, R2 render the operation of the pallet fork 11 independent or virtually independent of the regulator, because the impulses of the escape wheel are transmitted to the pallet fork when the decoupling member 13 is in abutment and because the release of the escape wheel 10 occurs when the decoupling member 13 is in the immediate vicinity of one of its extreme positions (for example, travel remaining to the extreme lower position at j/10): this prevents the impulses or the escape from disrupting the regulator;
the energy supplied to the regulator 12 by the escape wheel during each impulse phase is determined by the energy loaded in the spring R1, this load being entirely determined by its state of deformation at the end of the impulse from the escape wheel 10: here, this deformation state is entirely determined by the extreme position of the decoupling member 13 and the corresponding rest position of the pallet fork 11, so that this energy transfer is strictly constant.

Figure 10:
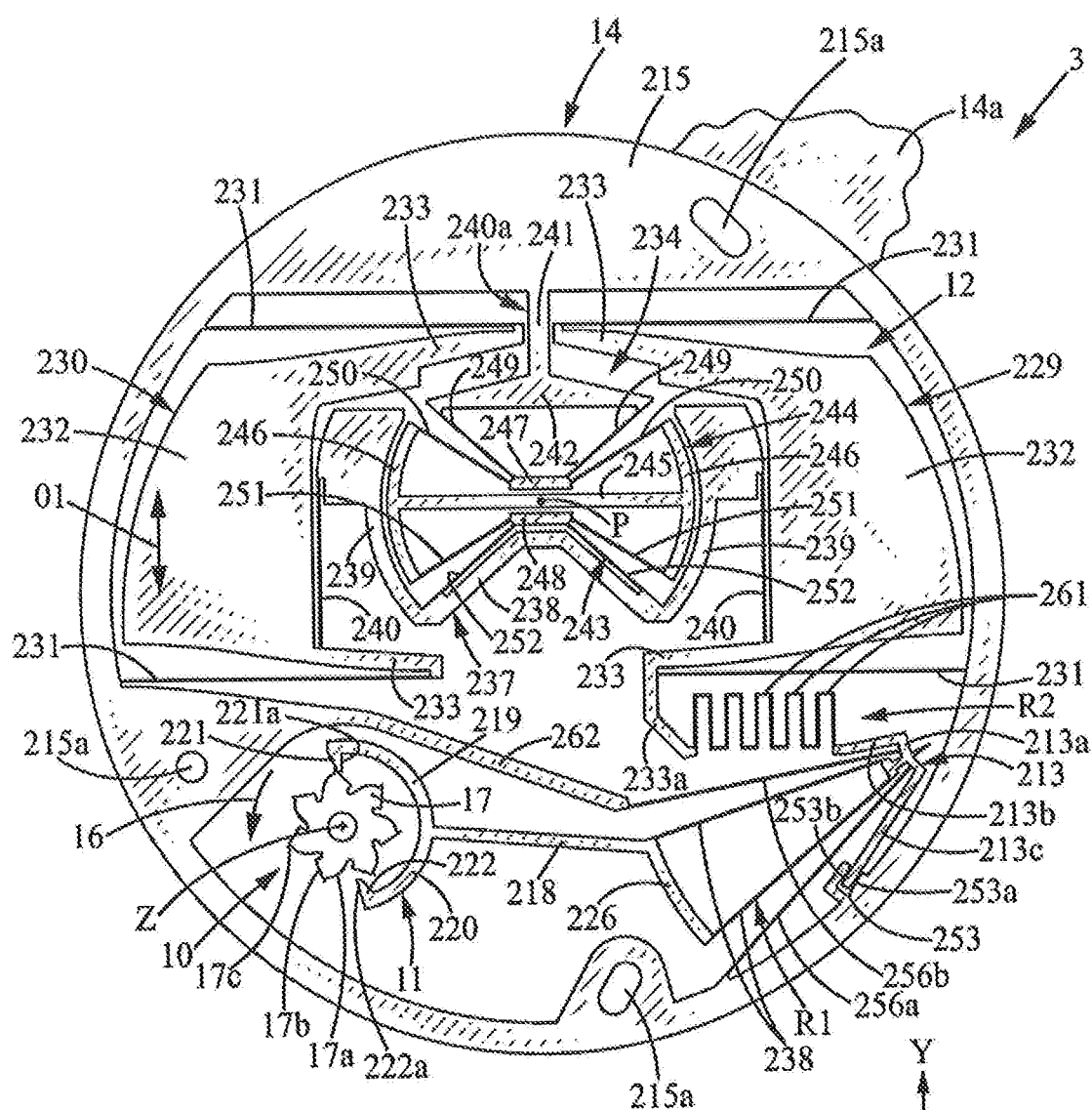
FIG. 10 is a view similar to FIG. 3, in a second embodiment of the invention.

In the second embodiment of the invention, shown in FIG. 10, the regulator 12, the pallet fork 11, and the decoupling member 13 can again be an integral one-piece system formed in the same plate 14 (usually planar) as explained above for the first embodiment of the invention, and are designed to move substantially within a central plane of said plate 14.

As described above, the plate 14 forms a fixed outer frame 215 which is fixed to a support plate 14a, for example by screws or the like (not shown) traversing holes 215a in the frame 215. The support Plate 14a is secured to the case 2 of the timepiece L. The frame 215 may at least partially surround the energy distributing member 10, the pallet fork 11, and the regulator 12.

The energy distributing member 10 may be an escape wheel identical or similar to the one described above with reference to FIGS. 3 and 3A.

The pallet fork 11 is a rigid part which may have a raid body 218 extending for example substantially radially relative to the axis of rotation Z of the escape wheel 1, and two rigid parallel side arms 219, 220 extending from the rigid body 218 so as to partially encompass the escape wheel 10. The arms 219, 220 respectively comprise two stop members 221, 222 in the form of fingers projecting from the arms 219, 220 towards one another radially relative to the rotation axis Z. The stop members 221, 222 may be similar to those of FIGS. 3 and 3A, and may each comprise a stop face 221a, 222a arranged substantially radially relative to the axis of rotation Z and adapted to engage by abutment with the tips 17C of the escape wheel.

The pallet fork 11 is elastically connected to the frame 215 so as to be rotatable about a center of rotation distanced from the escape wheel 10 (not shown, and described further below), such that the stop members 221, 222 move substantially radially relative to the axis of rotation Z of the escape wheel.

Advantageously, the pallet fork 11 may be connected to the frame 15 by an elastic suspension comprising a rigid decoupling member 213 which will be described below.

The regulator 12 is a mechanical oscillator having first and second regulating members 229, 230 each forming a rigid inertial mass, each connected to the frame 215 by an elastic suspension which enables the first and second regulating members 229, 230 to oscillate about the Y axis in a translation direction O1.

The elastic suspensions of the first and second regulating members 229, 230 may each have for example two elastic arms 231 extending Substantially along the X axis and connected to the frame 215.

Each of the first and second regulating members 229, 230 is mounted on the frame 215 so as to oscillate in circular translation, with an oscillation amplitude in the translation direction O1 and with a non-zero secondary oscillation amplitude perpendicular to the translation direction O1. Said oscillation amplitude in the translation direction O1 is greater than the secondary oscillation amplitude of the first and second regulating members, for example at least 10 times greater than the secondary oscillation amplitude.

In the example shown, the first and second regulating members 229, 230 may each have a C shape, with a main body 232 extending along the Y axis between two lateral arms 233 extending inward into the frame 215. Said elastic arms 231 may advantageously be connected to the free ends of the lateral arms 233, which allows the elastic arms 231 to be long and therefore particularly flexible.

The first and second regulating members 229, 230 may be two symmetrical parts of identical or substantially identical mass. They may define a free central space 234 between them.

A rigid balancing lever 237 is arranged within the free inner space 234, mounted so as to pivot about a central center of rotation P. The balancing lever 237 may possibly substantially have an M shape, with a central portion 238 in the form of a V diverging from the center of rotation P and two lateral arms 239.

The lateral arms 239 may be connected respectively to the first and second regulating members 229, 230, for example by two elastic arms 240 extending substantially along the Y axis.

The balancing lever 237 may be mounted, by an elastic suspension 243, on a rigid support 240a rigidly connected to the frame 215. The rigid support 240a may for example comprise an arm 241 extending along the Y axis between the regulating members 229, 230, from the frame 15 to a head 242 which may for example extend along the X axis, giving a T shape to the support 240a.

The elastic suspension 243 may for example comprise:
a rigid pivoting member 244 arranged inside the balancing lever 237, comprising for example a central rib 245 at the center of rotation P, extending along the X axis between two wide heads 246,
two rigid intermediate bodies 247, 248, arranged one on either side of the central rib 245 and near the center of rotation P,
two elastic arms 249 respectively connecting the free ends of the head 242 of the rigid support 240a to rigid intermediate body 247, two elastic arms 250 respectively connecting rigid intermediate body 247 to one of the free ends of the wide heads 246, two elastic arms 251 symmetrical to the elastic arms 250, respectively connecting rigid intermediate body 248 to the other of the free ends of the wide heads 246, two elastic arms 252 connecting rigid intermediate body 248 to the respective ends of the central portion 238 of the balancing lever.

The balancing lever 237 requires the first and second regulating members 229, 230 to move symmetrically and in opposite directions along the translation direction O1.

These opposing movements allow dynamic balancing of the mechanism, which reduces the sensitivity of the mechanism to impacts, gravity, and more generally to accelerations.

The decoupling member 213 may comprise for example a rigid base 213 and two rigid arms 213b, 213c which diverge towards the escape wheel 10, the directions of the arms 213b, 213c intersecting for example substantially at said center of rotation of the pallet fork 11.

The decoupling member 213 may be mounted so as to pivot on the frame 215 about said center of rotation of the pallet fork 11, for example by two elastic arms 256a, 256b which diverge from the base 213a, between the arms 213b, 213c of the decoupling member, and are connected to the frame 215. The elastic arm 256a farthest from the regulator 12 may for example be directly connected to the frame 215, and the other elastic arm 256b which is closest to the regulator 12 may be connected to a rigid arm 262 extending into the interior of the frame 215 in a slightly inclined direction relative to the Y axis.

This arm 262 may possibly partially separate the escape wheel 10 and pallet fork 11 from the regulator 12.

The decoupling member 213 may be elastically connected to the pallet fork 11, for example by two elastic arms 238 which diverge from the base 213 and extend inside said elastic arms 256a, 256b to a rigid arm 226 integral with the body 218. The directions of the two elastic arms may advantageously intersect substantially at said center of rotation of the pallet fork 11. These elastic arms 238 may form the first spring R1 mentioned in the first embodiment.

The rigid arm 213b which is closest to the regulator 12 may be connected to said regulator 12 by a second spring R2, formed for example by an elastic arm forming a succession of slots 261. More specifically, this elastic arm may be connected to a rigid extension 233a of the arm 232 of the second regulating member 230.

As explained in the first embodiment, the decoupling member 213 is arranged to oscillate between two extreme positions with the same period of oscillation as the regulator, but with a lower amplitude which is imposed by motion limiting means (advantageously, two stops which the decoupling member oscillates between and which restrict the travel of the decoupling member to require it to remain motionless for a portion of the period of oscillation).

In the example of FIG. 10, these limiting means may comprise for example a notch 253 formed in the frame 215 and in which the free end of the arm 213b farthest from the regulator 12 is engaged. This notch 253 is defined between two stop faces 253a, 253b which restrict the movements of the decoupling member 213, as explained in the first embodiment.

Figure 11:
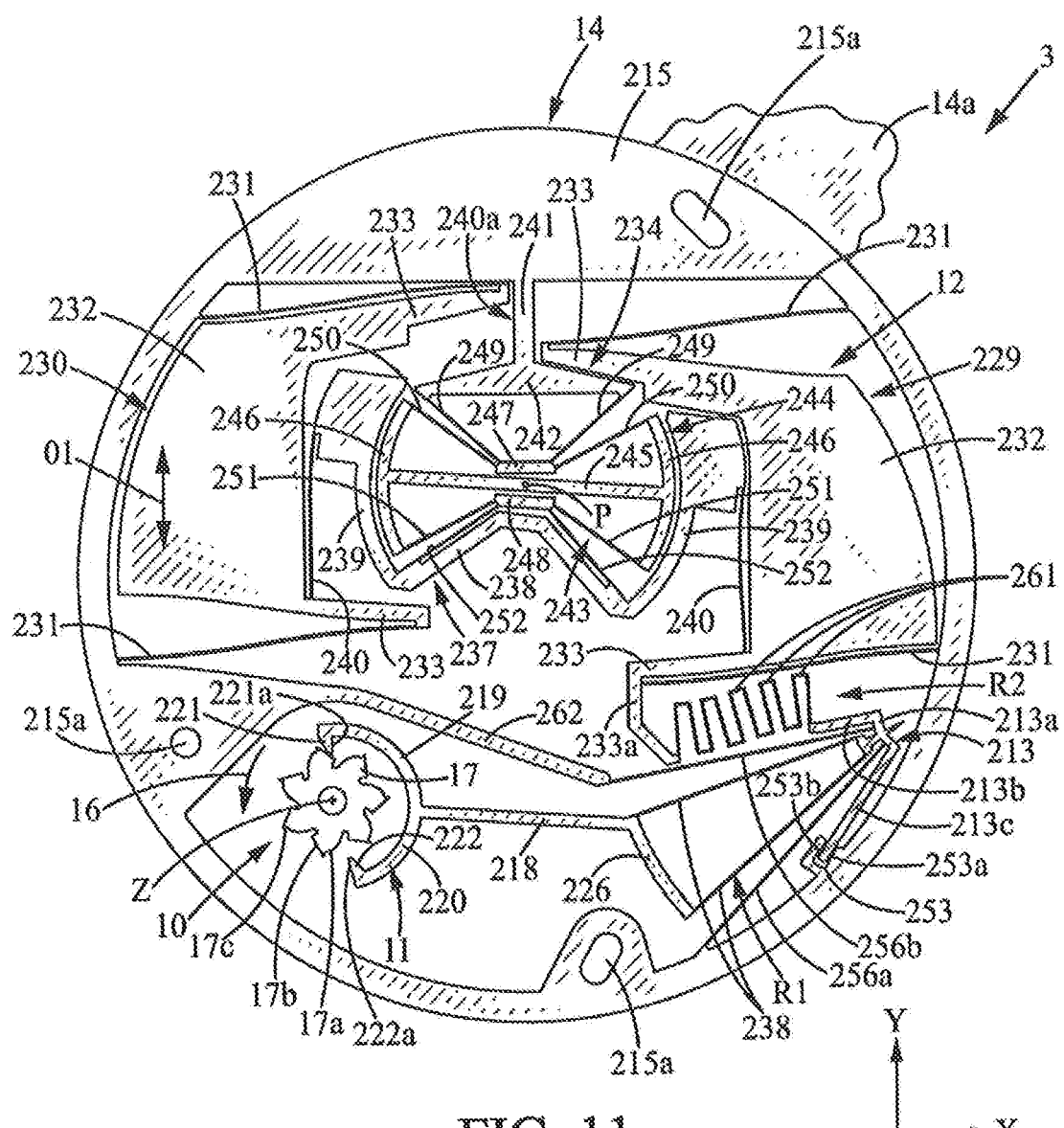
FIGS. 11 and 12 are views similar to FIG. 10, showing two extreme positions of the regulator.
Figure 12:
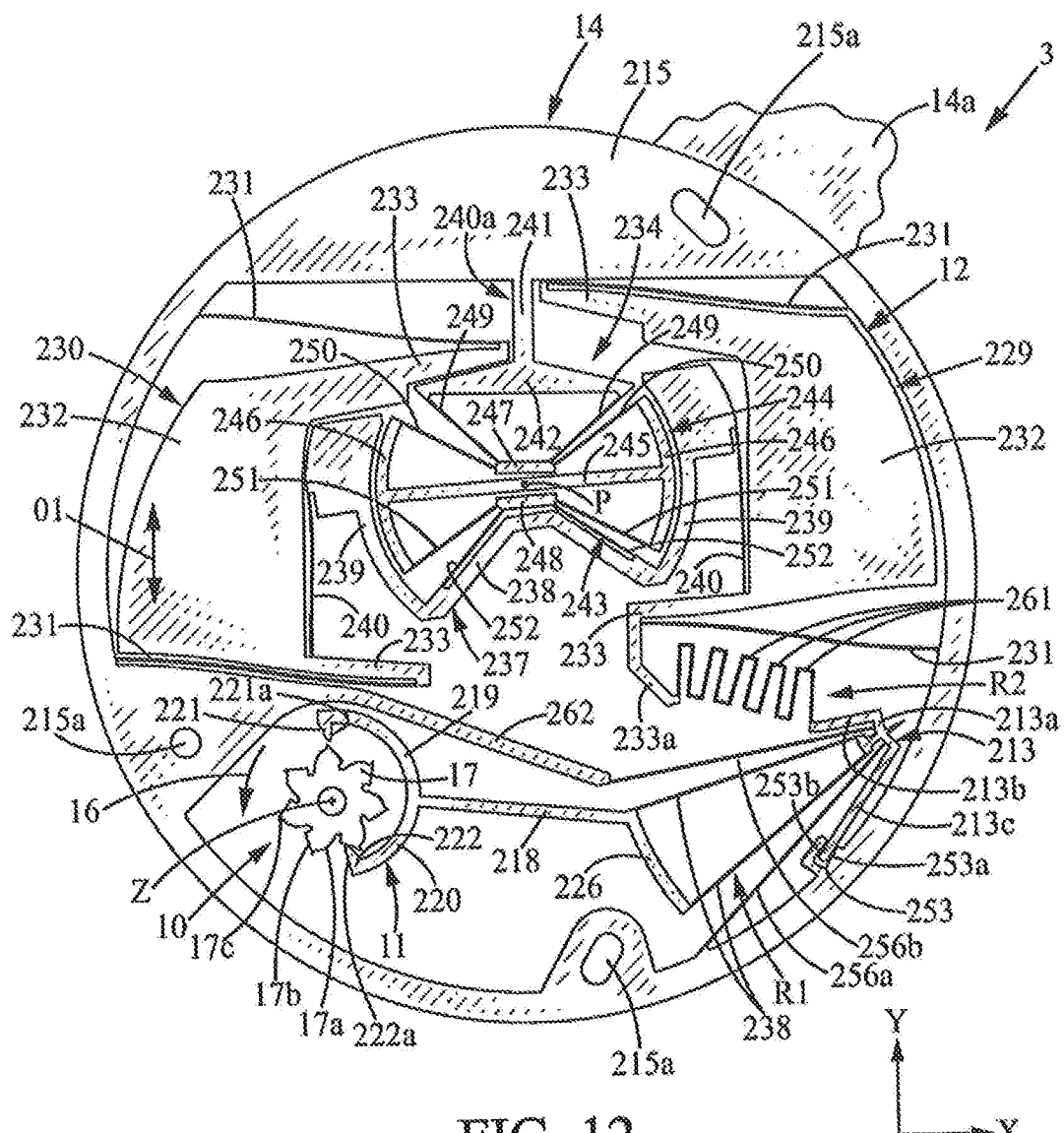

The operation of the mechanism in the second embodiment is similar to that already described in the first embodiment. The first and second regulating members 229, 230 oscillate in the translation direction O1 between the two extreme positions respectively shown in FIGS. 11 and 12, with a frequency f which may be for example between 20 and 30 Hz. Due to the restricted movement of the decoupling member 213, said member remains motionless against the stops 253a, 253b during a total stop time which is greater than 75% of the period of oscillation T of the regulator, in particular greater than 80% of T. The total stop time may also be less than 95% of the period of oscillation T, in particular less than 90% of T.

The invention claimed is:

1. A mechanism for a timepiece comprising:
    a regulator comprising a regulating member adapted to oscillate with a certain nominal amplitude and a certain period of oscillation;
    an energy distributing member provided with teeth and intended to be biased by an energy storage device;
    a pallet fork engaging with the teeth of the energy distributing member, said pallet fork being controlled by the regulator to periodically and alternately lock and release the energy distributing member so that said energy distributing member is biased by the energy storage device to move in incremental steps in a cycle of repetitive motion, and said pallet fork being adapted to transfer mechanical energy to the regulator during this cycle of repetitive motion;
    said mechanism comprising:
    a decoupling member elastically connected to the pallet fork by a first elastic link and to the regulating member by a second elastic link, said decoupling member being arranged to oscillate with a certain amplitude between first and second extreme positions and with the same period of oscillation as the regulating member;
    motion limiting means for imposing said extreme positions.

2. The mechanism according to claim 1, wherein the motion limiting means comprise two stop elements between which the decoupling member oscillates.

3. The mechanism according to claim 1, wherein the pallet fork and the energy distributing member are shaped so that, whenever the energy distributing member moves, said energy distributing member supplies an impulse to the pallet fork in order to transfer mechanical energy to the first elastic link just before being relocked by the pallet fork.

4. The mechanism according to claim 1, wherein the pallet fork is mounted on an elastic suspension.

5. The mechanism according to claim 1, wherein the pallet fork and the first elastic link are designed so that the pallet fork only releases the energy distributing member when the decoupling member is in one of the first and second extreme positions.

6. The mechanism according to claim 1, wherein the energy distributing member is an escape wheel and the pallet fork comprises first and second stop members arranged one on each side of the escape wheel along an escape direction, the first and second stop members being adapted to alternate in locking the teeth of the escape wheel, the pallet fork being mounted and shaped so as to occupy first and second rest positions respectively when the first and second stop members lock the teeth of the escape wheel, and to oscillate between two extreme oscillation positions located one on each side of the two rest positions along the escape direction.

7. The mechanism according to claim 6, wherein the decoupling member is movable along the escape direction between said first and second extreme positions, the first elastic link being designed to move the pallet fork in a first direction along the escape direction by distancing the first stop member from the escape wheel when the decoupling member is in the immediate vicinity of the first extreme position, the first elastic link being designed to move the pallet fork in a second direction opposite to the first direction along the escape direction by distancing the second stop member from the escape wheel when the decoupling member is in the immediate vicinity of the second extreme position, the first extreme position being offset along the first direction relative to the second extreme position.

8. The mechanism according to claim 7, wherein the pallet fork and the eseape wheel are shaped such that, whenever the escape wheel moves, said escape wheel supplies an impulse to the pallet fork in order to transfer mechanical energy to the first electric link just before being relocked by the pallet fork, and wherein the escape wheel and the pallet fork are designed so that at the end of each impulse, the first elastic link is in a state of elastic deformation dictated geometrically either by the first rest position of the pallet fork and the second extreme position of the decoupling member or by the second rest position of the pallet fork and the first extreme position of the decoupling member.

9. The mechanism according claim 6, wherein the pallet fork and the escape wheel are shaped such that, whenever the escape wheel moves, said escape wheel supplies an impulse to the pallet fork in order to transfer mechanical energy to the first elastic link just before being relocked by the pallet fork.

10. The mechanism according to claim 9, wherein the escape wheel is designed to rotate in a single direction of rotation and each tooth of the escape wheel has a convex front edge, oriented in the direction of rotation, which is adapted to act as a cam on either the first stop member or the second stop member in order to supply said impulse to the pallet fork, said convex front edge extending in an angular direction that is opposite to the direction of rotation, to a stop edge adapted to abut against either the first stop member or the second stop member in order to lock the escape wheel.

11. The mechanism according to claim 1 wherein the amplitude of the decoupling member is less than the nominal oscillation amplitude of the regulating member.

12. The Mechanism according to claim 11, wherein the amplitude of the decoupling member is less than 25% of the nominal oscillation amplitude of the regulating member, and the amplitude of the decoupling member is greater than 10% of the nominal oscillation amplitude of the regulating member.

13. The mechanism according to claim 1, wherein the amplitude of the decoupling member is greater than 5% of the nominal oscillation amplitude of the regulating member.

14. The mechanism according to claim 1, wherein the motion limiting means are adapted to keep the decoupling member motionless for a certain stop time at each of the extreme positions, the decoupling member being immobilized during each period of oscillation for a total stop time which is greater than 75% of the period of oscillation.

15. The mechanism according to claim 14, wherein the total stop time is less than 95% of the period of oscillation.

16. The mechanism according to claim 14, wherein said total stop time is greater than 80% of the period of oscillation, and the total stop time is less than 90% of the period of oscillation.

17. The mechanism according to claim 1, wherein the decoupling member is rigid.

18. The mechanism according to claim 1, wherein the regulator, the pallet fork, and the decoupling member constitute an integral one-piece system formed in a same plate and are designed to move substantially within a central plane of said plate.

19. The mechanism according to claim 1, wherein the decoupling member is guided by an elastic suspension connecting said decoupling member to a fixed support.

20. A timepiece comprising a mechanism as claimed in claim 1.

* * * * *